(12) United States Patent
Wilkinson et al.

(10) Patent No.: US 11,570,908 B2
(45) Date of Patent: Jan. 31, 2023

(54) DESIGNING A PRINTED CIRCUIT BOARD (PCB) TO DETECT SLIVERS OF CONDUCTIVE MATERIAL INCLUDED WITHIN VIAS OF THE PCB

(71) Applicant: Juniper Networks, Inc., Sunnyvale, CA (US)

(72) Inventors: Steve M. Wilkinson, San Mateo, CA (US); Daniel J. Prezioso, Saugus, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 30 days.

(21) Appl. No.: 17/248,569

(22) Filed: Jan. 29, 2021

(65) Prior Publication Data

US 2021/0153359 A1 May 20, 2021

Related U.S. Application Data

(62) Division of application No. 15/647,984, filed on Jul. 12, 2017, now Pat. No. 10,917,976.

(51) Int. Cl.
| | |
|---|---|
| *H05K 1/02* | (2006.01) |
| *H05K 1/09* | (2006.01) |
| *H05K 1/11* | (2006.01) |
| *H05K 1/18* | (2006.01) |
| *H05K 3/00* | (2006.01) |
| *H05K 3/22* | (2006.01) |
| *H05K 3/36* | (2006.01) |
| *H05K 3/40* | (2006.01) |
| *H05K 3/42* | (2006.01) |
| *H01L 23/498* | (2006.01) |

(52) U.S. Cl.
CPC ............. *H05K 3/425* (2013.01); *H05K 3/22* (2013.01)

(58) Field of Classification Search
CPC ... H05K 1/02; H05K 1/09; H05K 1/11; H05K 1/18; H05K 3/00; H05K 3/22; H05K 3/36; H05K 3/40; H05K 3/42; H05K 3/425; H01L 23/498
USPC ........ 174/266, 251, 260, 262; 316/119, 792; 333/175; 361/119, 792
See application file for complete search history.

(56) References Cited

U.S. PATENT DOCUMENTS

| | | |
|---|---|---|
| 5,172,063 A | 12/1992 | Munikoti et al. |
| 6,512,377 B1 | 1/2003 | Deng et al. |
| 7,196,906 B1 * | 3/2007 | Alexander ........... H05K 3/4688 361/760 |

(Continued)

OTHER PUBLICATIONS

Xu B., et al., "Impact of Differential Vias on High-Speed Connection Design," IEEE, 2009, 4 pages.

*Primary Examiner* — Xiaoliang Chen
(74) *Attorney, Agent, or Firm* — Harrity & Harrity, LLP

(57) ABSTRACT

A method may include obtaining a printed circuit board (PCB) that includes a set of vias that include a set of stub regions. The PCB may include a set of layers perpendicular to the set of vias. The set of layers may include a signal layer and a ground layer. The ground layer may be located between the set of stub regions and the signal layer. The method may include drilling to remove at least a portion of a stub region of a via of the set of vias. The method may include performing an electrical test to determine whether a sliver of conductive material is included within the via after drilling to remove the at least a portion of the stub region of the via.

20 Claims, 5 Drawing Sheets

(56) References Cited

U.S. PATENT DOCUMENTS

| | | | |
|---|---|---|---|
| 7,988,457 B1* | 8/2011 | Morgan | H01R 13/6474 439/82 |
| 8,332,177 B2 | 12/2012 | Liang et al. | |
| 8,508,248 B1 | 8/2013 | Chengson et al. | |
| 8,841,560 B1 | 9/2014 | Roberts et al. | |
| 8,866,563 B1 | 10/2014 | Ben Artsi | |
| 9,185,794 B1* | 11/2015 | Reynov | H05K 1/183 |
| 9,202,783 B1* | 12/2015 | Simpson | H01L 23/50 |
| 9,341,670 B2 | 5/2016 | Bartley et al. | |
| 9,444,162 B1* | 9/2016 | Becker | H05K 1/0243 |
| 9,488,690 B2 | 11/2016 | Bartley et al. | |
| 9,739,825 B2 | 8/2017 | Bartley et al. | |
| 9,907,156 B1* | 2/2018 | Anand | H05K 1/0298 |
| 10,917,976 B1 | 2/2021 | Wilkinson | |
| 2004/0176938 A1* | 9/2004 | Gisin | H05K 3/0005 703/14 |
| 2005/0128672 A1* | 6/2005 | Tourne | H05K 3/0047 29/830 |
| 2005/0161254 A1* | 7/2005 | Clink | H05K 1/0251 174/262 |
| 2006/0090933 A1* | 5/2006 | Wig | H05K 1/115 174/262 |
| 2006/0199390 A1* | 9/2006 | Dudnikov, Jr. | H05K 3/429 257/773 |
| 2006/0243481 A1* | 11/2006 | Bachar | H05K 1/0216 174/262 |
| 2007/0091581 A1* | 4/2007 | Gisin | H05K 1/0246 174/262 |
| 2008/0164058 A1* | 7/2008 | Saito | H05K 1/112 174/262 |
| 2008/0217052 A1* | 9/2008 | Matsui | H05K 1/115 174/266 |
| 2008/0227311 A1* | 9/2008 | Chan | H01R 13/6461 439/74 |
| 2009/0045889 A1* | 2/2009 | Goergen | H05K 1/0216 174/266 |
| 2010/0276192 A1* | 11/2010 | Pai | H05K 3/4623 174/266 |
| 2011/0240348 A1* | 10/2011 | Lau | H05K 3/429 174/257 |
| 2012/0012380 A1* | 1/2012 | Miller | H05K 3/0047 29/852 |
| 2012/0234587 A1* | 9/2012 | Nakamura | H05K 3/429 29/830 |
| 2012/0236523 A1* | 9/2012 | Yasuo | H05K 3/308 174/257 |
| 2013/0098671 A1* | 4/2013 | Thurairajaratnam | H05K 1/024 174/266 |
| 2013/0112465 A1 | 5/2013 | Duvanenko et al. | |
| 2014/0093321 A1 | 4/2014 | Liu | |
| 2014/0182891 A1* | 7/2014 | Rengarajan | H05K 1/0222 174/251 |
| 2014/0251663 A1* | 9/2014 | Iketani | H05K 3/42 174/255 |
| 2014/0262455 A1* | 9/2014 | Iketani | H05K 1/115 174/255 |
| 2015/0047892 A1* | 2/2015 | Yang | H05K 3/0047 174/262 |
| 2015/0342057 A1* | 11/2015 | Bartley | H05K 3/429 408/2 |
| 2015/0348901 A1* | 12/2015 | Warwick | H01L 23/5286 257/774 |
| 2016/0065334 A1* | 3/2016 | Warwick | H04L 1/243 370/249 |
| 2016/0183373 A1* | 6/2016 | Williams | H05K 1/0231 174/251 |
| 2017/0163286 A1* | 6/2017 | Wu | G06F 13/4068 |
| 2018/0077800 A1* | 3/2018 | Xiong | H05K 1/115 |
| 2018/0184524 A1 | 6/2018 | Xiong et al. | |

* cited by examiner

DESIGNING A PRINTED CIRCUIT BOARD (PCB) TO DETECT SLIVERS OF CONDUCTIVE MATERIAL INCLUDED WITHIN VIAS OF THE PCB

RELATED APPLICATION

This application is a divisional of U.S. patent application Ser. No. 15/647,984, filed Jul. 12, 2017 (now U.S. Pat. No. 10,917,976), which is incorporated herein by reference.

BACKGROUND

A printed circuit board (PCB) may include one or more material layers that mechanically support and electrically connect electronic components using conductive pathways. The conductive pathways may be etched from copper sheets laminated onto a non-conductive substrate.

SUMMARY

According to some possible implementations, a method may include obtaining a printed circuit board (PCB) that includes a set of pads associated with facilitating a connection to a component, a set of vias electrically connected to the set of pads, and a set of layers perpendicular to the set of vias. The set of vias include a set of stub regions. The set of layers include a signal layer and a ground layer. The ground layer may be located between the set of stub regions and the signal layer. The method may include drilling to remove at least a portion of a stub region of a via of the set of vias. The drilling may create a ring of conductive material around a portion of the ground layer that connects to the via. The method may include performing an electrical test to determine whether a sliver of conductive material is included within the via after drilling to remove the at least a portion of the stub region of the via.

According to some possible implementations, a printed circuit board (PCB) may include a set of pads associated with facilitating a connection to a component, a set of vias electrically connected to the set of pads, and a set of layers perpendicular to the set of vias. The set of vias may be back drilled to remove at least a portion of a set of stub regions associated with the set of vias. The set of layers may include a signal layer and a ground layer. The ground layer may be located between the set of stub regions and the signal layer. The ground layer may include a ring of conductive material around portions of the ground layer that connect to the set of vias.

According to some possible implementations, a method may include obtaining a printed circuit board (PCB) that includes a set of vias and a set of layers perpendicular to the set of vias. The set of vias may include a set of stub regions. The set of layers may include a signal layer and a ground layer. The ground layer may be located between the set of stub regions and the signal layer. The method may include drilling to remove at least a portion of a stub region of a via of the set of vias. The method may include performing an electrical test to determine whether a sliver of conductive material is included within the via after drilling to remove the at least a portion of the stub region of the via.

DETAILED DESCRIPTION

Figure 1A:
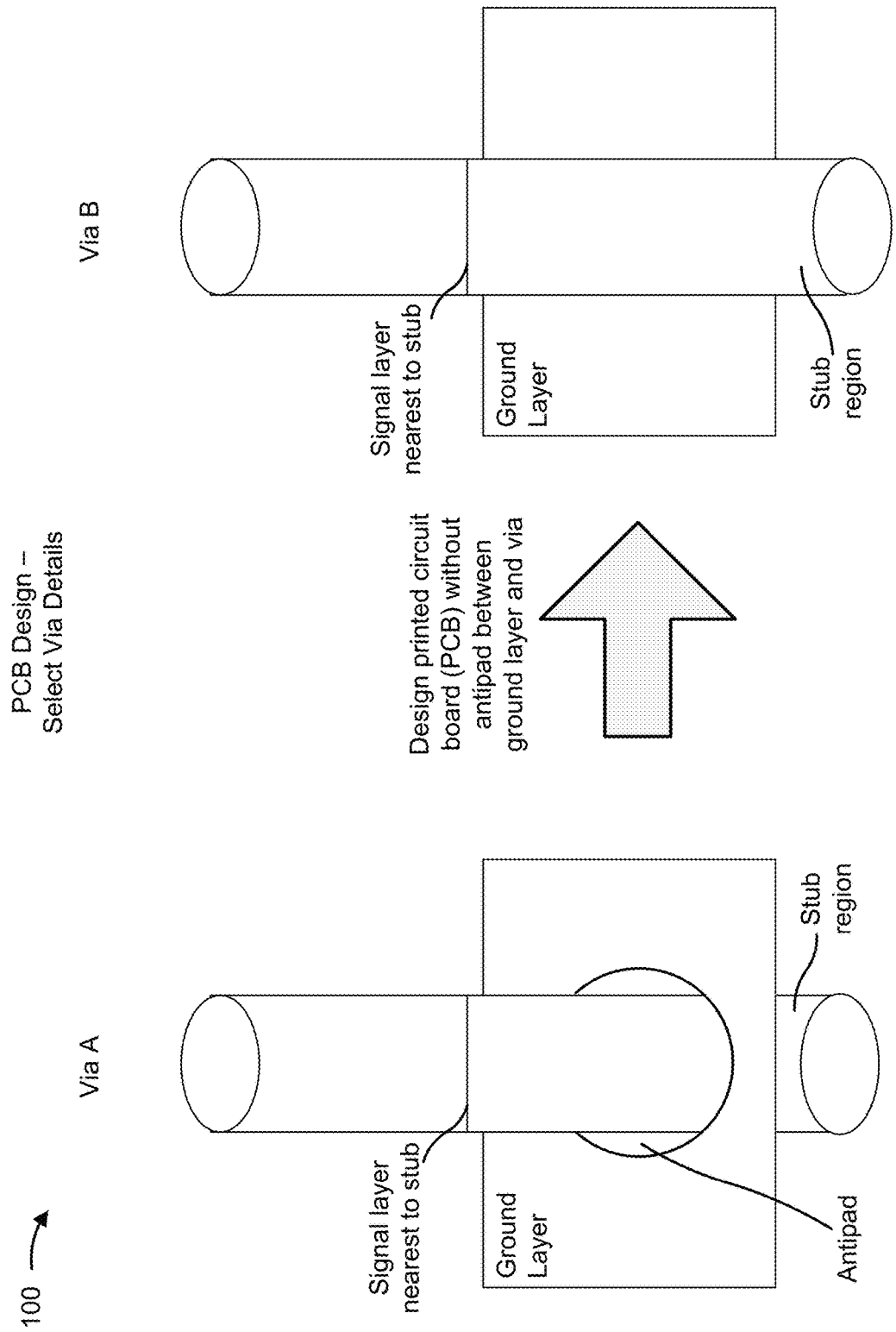
FIGS. 1A-1C are diagrams of an overview of an example implementation described herein.

The following detailed description of example implementations refers to the accompanying drawings. The same reference numbers in different drawings may identify the same or similar elements.

A PCB mechanically supports and electrically connects electronic components using conductive pathways etched from copper sheets that are laminated onto a non-conductive substrate. The conductive pathways may be organized as a number of layers on the PCB to increase the signal transmission density of the PCB.

PCBs may be used in high frequency applications. For example, a PCB may be populated with an integrated circuit used to enable high speed serial links to and from the PCB, as may be utilized for an Ethernet switch, a serializer/deserializer (SerDes), or the like. In a high frequency application, the PCB can experience significant signal integrity disturbances as a result of the unused portions of through-holes and vias, such as a stub portion that extends past the last connected layer of the PCB. The stub may present resonances, present impedance discontinuities, and increase the loss of the channel, thereby limiting performance.

To remove the stub, PCB manufacturers implement a technique known as back drilling. Back drilling involves using a drill bit slightly larger in diameter than the drill bit used to create the original via hole to remove the undesired conductive plating in the stub region of the via. However, if a drill is not properly registered, the drill bit may not be properly aligned in the center of the hole of the via (e.g., a center point of the drill bit needs to be aligned to a center point of the hole of the via). Back drilling without a properly centered drill bit may cause a sliver of conductive material (e.g., a copper sliver) to remain within the via (i.e., a remnant of the conductive plating), which may cause signal integrity disturbances. Furthermore, manual detection of conductive slivers may be difficult when a PCB has hundreds, or even thousands, of vias.

Some implementations described herein provide a PCB design process to detect slivers of conductive material using an electrical test. For example, the process may include designing a PCB to exclude an antipad between a ground layer and a via. The ground layer may be between a stub region of the via and a signal layer that is nearest to the stub region. In this case, the stub region of the via may be back drilled to create a ring of conductive material around the ground layer of the via. An electrical test may be performed on the via. If the back drilling is not positioned properly and creates a sliver of conductive material, the sliver will come into contact with the ring of conductive material around the ground layer. This may create a short circuit that causes the via to fail the electrical test. If the back drilling is positioned properly and does not create a sliver of conductive material, an electrical charge will not come into contact with the ring of conductive material, resulting in the via passing the electrical test.

By reducing stub length via back drilling, a PCB design process reduces signal distortion (e.g., deterministic jitter). Furthermore, by using an electrical test to detect slivers of conductive material within vias of a PCB, the PCB design process reduces signal attenuation and crosstalk relative to a PCB design process that is unable to detect the slivers of conductive material.

Figure 1B:
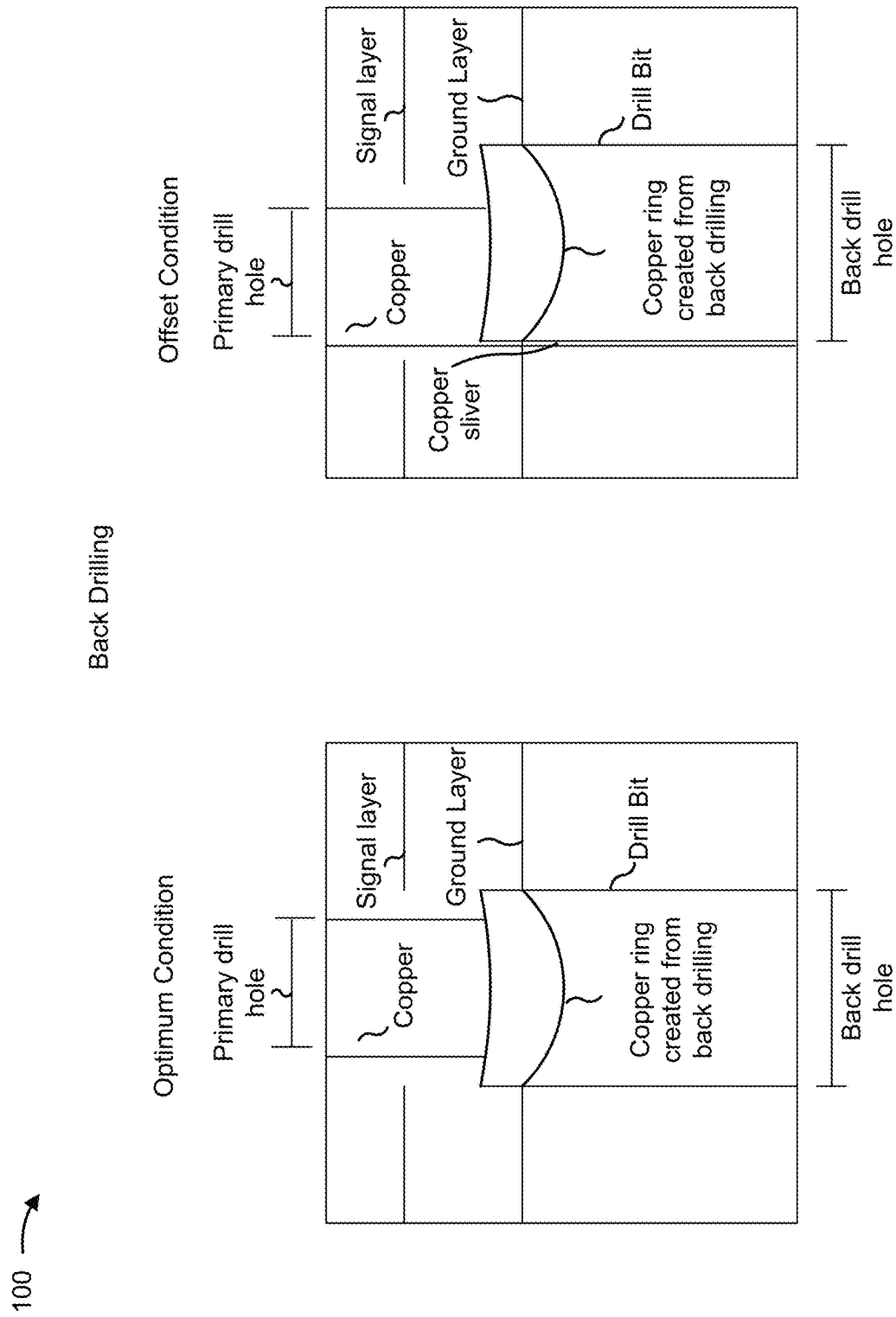
Figure 1C:
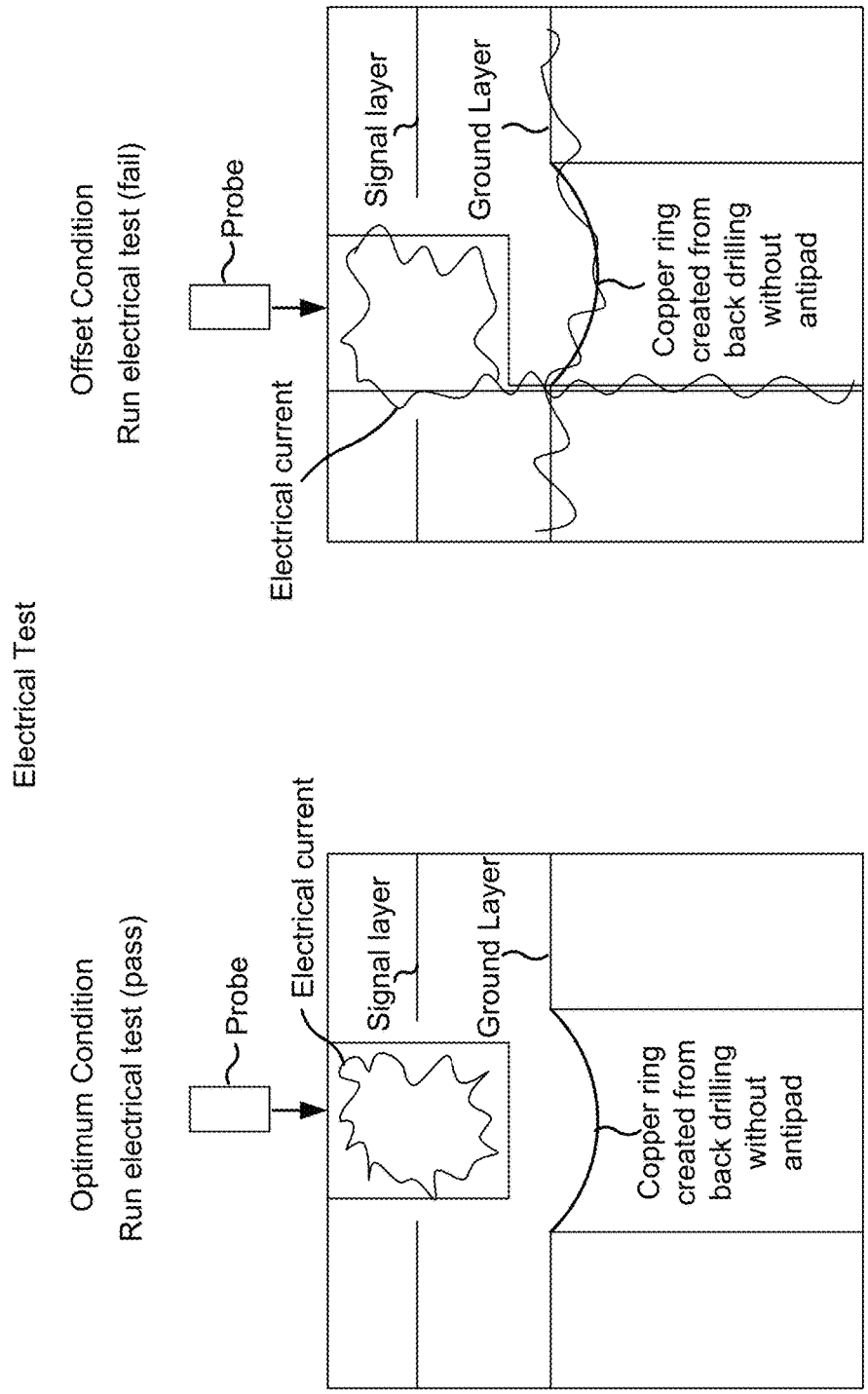

FIGS. 1A-1C are diagrams of an overview of an example implementation 100 described herein. FIGS. 1A-1C show a PCB design process with respect to a single via. In practice, the PCB design process shown may apply to a set of vias (e.g., hundreds, thousands, tens of thousands, or even hundreds of thousands of vias) within a PCB.

As shown in FIG. 1A, by via A, a PCB design engineer may design a PCB that includes an antipad between a ground layer and via A. In contrast, and as shown by via B, a PCB design engineer may design a PCB so that a ground layer of via B comes into physical contact with via B (e.g., by designing the PCB without an antipad between the ground layer and via B). The ground layer may be located between a stub region of via B and a signal layer that is nearest to the stub region (e.g., in relation to other signal layers). In some cases, the PCB may be designed using a computer-aided design (CAD) technique, a computer-aided manufacturing (CAM) technique, or the like.

By designing the PCB to exclude an antipad between the ground layer and the via, the stub region of the via may be back drilled to leave a ring of copper that may be used to detect copper slivers, as described further herein.

As shown in FIG. 1B, the PCB design process may include back drilling the via. For example, the PCB design process may modify the via by using a back drilling technique to remove the stub region of the via. As shown by the "optimum condition," a drill bit that is properly centered between sides of a primary drill hole may remove the copper within the via (and not leave a copper sliver). In this case, the drill bit may leave a ring of copper around the ground layer as a result of back drilling without an antipad around the ground layer.

As shown by the "offset condition," a drill bit that is not properly centered between sides of the primary drill hole may remove a portion of the copper, but may leave a copper sliver. A drill bit may not be properly centered if the drill is not properly registered (e.g., a drilling location identified by software may not be centered), if the drill slips out of position upon making initial contact with the PCB, or the like. In this case, the back drilling may create a ring of copper around the ground layer as a result of back drilling without an antipad around the ground layer. Additionally, the copper sliver may come into contact with the copper ring around the ground layer.

By removing the antipad of the ground layer and back drilling, the PCB design process may create a ring of copper around the ground layer.

As shown in FIG. 1C, the PCB design process may include an electrical test. For example, the PCB design process may perform an electrical test (e.g., an in-circuit test (ICT)) using an electrical probe. In some cases, a test machine (i.e., a device capable of automatically performing electrical tests) may include a set of probes that may perform a set of electrical tests concurrently. In this case, the test machine may move a probe of the set of probes to a first via, conduct an electrical test, store a test result (e.g., pass, fail, etc.), and may move the probe to a second via to perform an additional electrical test. An electrical test may detect a copper sliver if the electrical test detects a short circuit. For example, if a copper sliver is present within a via, electrical current may travel through the copper sliver to the ring of copper associated with the ground layer, creating a short circuit at the ground layer.

As shown by the optimum condition, an electrical probe may provide electrical current to the via. In this case, the electrical current may not reach the ground layer because the back drilling did not create a copper sliver. As shown by the offset condition, an electrical probe may provide current to the via, and the current may travel from the copper sliver to the copper ring around the ground layer, electrifying the ground layer to cause a short circuit.

In some implementations, the electrical test may be performed on tens of vias, hundreds of vias, thousands of vias, tens of thousands of vias, hundreds of thousands of vias, or more, concurrently. Additionally, or alternatively, the electrical test may be performed using a test structure (e.g., a test coupon).

In this way, the PCB design process may use an electrical test to detect copper slivers. By detecting copper slivers, vias associated with the copper slivers may be re-drilled and re-tested to determine that the copper sliver has been removed, thereby reducing signal attenuation and crosstalk relative to a PCB that includes copper slivers.

As indicated above, FIGS. 1A-1C are provided merely as an example. Other examples are possible and may differ from what was described with regard to FIGS. 1A-1C. For example, while implementations described here provide for designing a PCB that excludes an antipad associated with a ground layer, other implementations may exist that provide for removing the antipad associated with the ground layer from a PCB that has already been designed to include an antipad.

Figure 2:
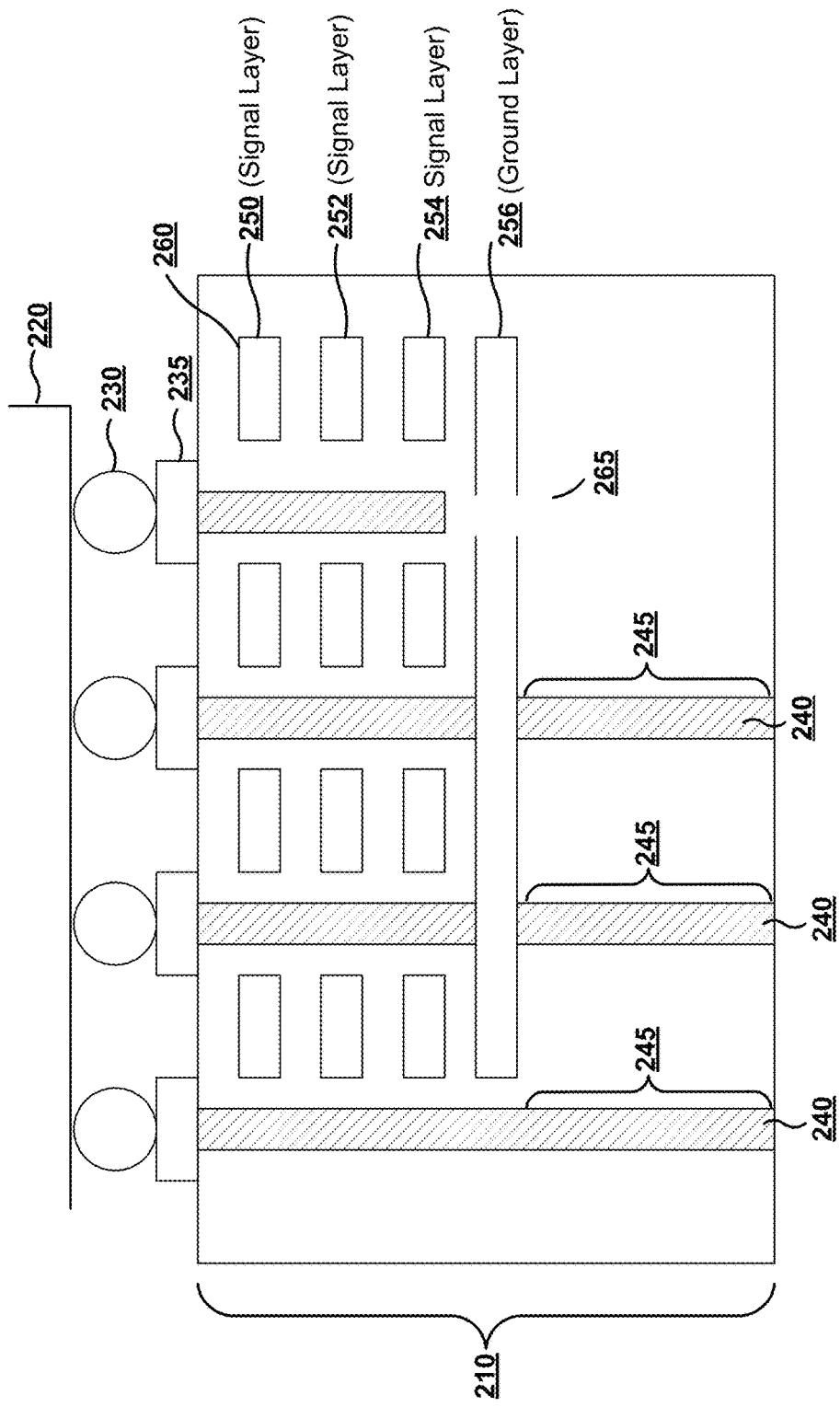
FIG. 2 is a diagram of an example PCB.

FIG. 2 is a diagram of an example implementation 200 of a PCB. Specifically, FIG. 2 is a diagram illustrating a cross-sectional view of a PCB. The cross-sectional view shown in FIG. 2 conceptually illustrates a layout of a PCB 210 as the layout of the PCB relates to the connection and routing of signals for a component 220. As shown, component 220 is illustrated as connected to PCB 210 via a ball grid array (BGA) 230. BGA 230 may, for example, be soldered to pads 235 of PCB 210.

PCB 210 is shown as including a number of vias 240. A via 240 may generally be a vertical electrical connection between different layers of PCB 210. A via 240 may include, at each layer, a pad that provides electrical connections between conductive traces on the layer or an antipad that defines a non-conductive "void" around the via 240 to insulate the via 240 from that layer. A number of example layers 250, 252, 254, and 256 are shown in PCB 210. Each layer 250-256 may include conductive traces (e.g., copper traces) that route power, signals, and/or ground through PCB 210. Each layer 250-256 may be generally electrically isolated from one another, but may be potentially connected through vias 240.

In some designs, it may be desirable to dedicate certain layers 250-256 as power layers, signal layers, or ground layers. A ground layer (also known as a ground plane) is an electrically conductive surface (e.g., often made of copper foil) connected to a power supply ground terminal. The ground layer may serve as a return path for current from different components of the PCB. As shown, a ground layer may be located between a signal layer 254 and a stub region 245. In some cases, the ground layer may be included in stub region 245. As shown, signal layer 254 may be nearest to stub region 245 relative to other signal layers (e.g., signal layer 252, signal layer 250, etc.).

The portion of the vias 240 that extend below the last layer to which the vias connect may be referred to as stub region 245. Stub region 245 may create undesirable distortions in the signals that traverse the vias and/or signals being routed at a layer adjacent to the vias. The distortions may become more acute as the operating frequency increases. To decrease the deleterious effect of stub region 245, a back drill may be used to physically remove stub region 245.

The rectangles shown in FIG. 2, such as rectangle 260, may represent conductive traces for the layers. The breaks in the rectangles around vias 240 may define the antipads (i.e., the non-conductive areas around a via 240). An antipad may function to isolate a via 240 from the PCB layer traversed by the via 240.

As shown by reference number 265, a first via 240 may be back drilled to physically remove the stub. The first via 240 may extend from BGA 230 to signal layer 254. Back drilling to remove the stub may create a circular ring of conductive material around a portion of ground layer 256 that connects to via 240 (the circular ring being visible from a top view).

The number and arrangement of layers and vias shown in FIG. 2 are provided as an example. In practice, there may be additional layers/vias, fewer layers/vias, different layers/vias, or differently arranged layers/vias than those shown in FIG. 2. Furthermore, two or more layers/vias shown in FIG. 2 may be implemented as a single layer/via, or a single layer/via shown in FIG. 2 may be implemented as multiple, different layers/vias.

Figure 3:
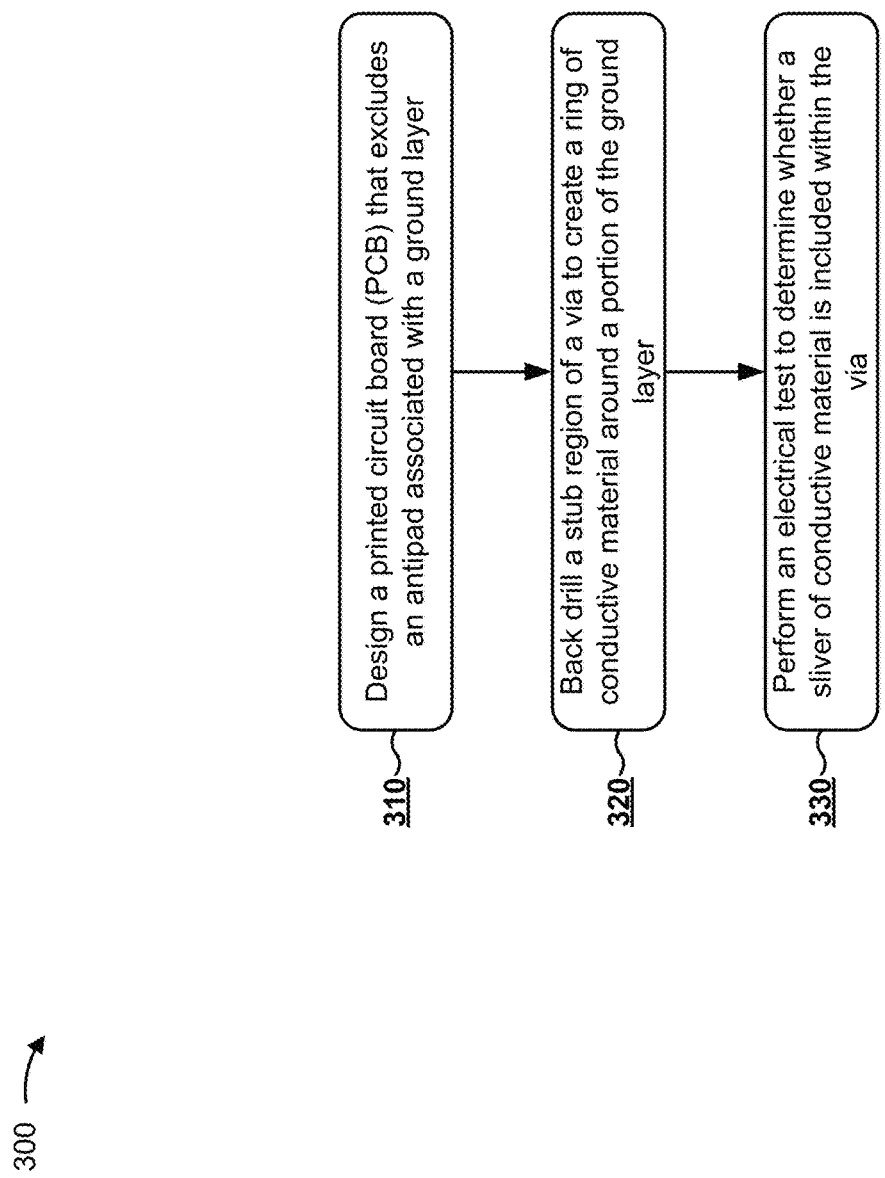
FIG. 3 is a flow chart of an example process for detecting slivers of conductive material included within vias of a PCB.

FIG. 3 is a flow chart of an example process 300 for detecting slivers of conductive material included within vias of a PCB. In some implementations, example process 300 may be applied to the design of a PCB used to route a set of high speed signals.

As shown in FIG. 3, process 300 may include designing a printed circuit board (PCB) that excludes an antipad associated with a ground layer (block 310). For example, a PCB design process may design a PCB that excludes an antipad associated with a ground layer that is located between a stub region and a signal layer that is nearest to the stub region (e.g., in relation to other signal layers). In this case, a user may interact with a device to utilize a computer-aided design (CAD) technique or a computer-aided manufacturing (CAM) technique to design the PCB in a manner that excludes the antipad associated with the ground layer. The antipad may define a non-conductive "void" around the via to insulate the via from the ground layer.

In some implementations, a user may interact with a device to utilize a CAD technique or a CAM technique to design a PCB without an antipad associated with a ground layer. For example, assume the ground layer is located between a stub region of the via and a signal layer that is nearest to the stub region. In this case, the user may design the PCB to include antipads for one or more layers of the PCB (e.g. power layers, signal layers, ground layers, etc.), but may not design the PCB to include an antipad for the ground layer. In this way, the ground layer may come into contact with conductive material (e.g., copper plating) associated with the via.

Additionally, or alternatively, a user may interact with a device to remove an antipad associated with a ground layer of a PCB. For example, assume a PCB is designed to include an antipad associated with a ground layer. In this case, a user may interact with a device to utilize a CAD technique or a CAM technique to "fill" the antipad to allow the ground layer to come into contact with conductive material associated with the via.

By designing a PCB to exclude an antipad associated with a ground layer, the stub region of the via may be back drilled to create a ring of conductive material that may be used in conjunction with an electrical test to detect whether slivers of conductive material are present after the back drilling, as described further herein.

As further shown in FIG. 3, process 300 may include back drilling a stub region of a via to create a ring of conductive material around a portion of the ground layer (block 320). For example, a PCB design process may use a back drill to remove a stub region of a via to create a ring of conductive material around a portion of the ground layer that connects to the via.

In some implementations, a back drill may be used to remove at least a portion of the stub region of the via. For example, assume a primary drill is used to create a first hole with a diameter D. Further assume that the hole is plated with conductive material. In this case, a back drill may be used to drill a second hole with diameter D+x (e.g., the second hole may be larger than the first hole). As an example, the back drill may remove all but approximately 2 thousandths of an inch (mils) to approximately 12 mils of the stub.

In some implementations, back drilling may be used to remove conductive material associated with the stub region. For example, back drilling may remove conductive material by drilling from a first area to a second area. The first area may be a side of the via (e.g., a "stub" side that is opposite from a side of the via that connects to component 220). The second area may be an area within the via that is between the ground layer and a signal layer. The signal layer may be nearest to the stub region of the via relative to other signal layers. In this case, a back drill may drill from the first area to the second area (e.g., past the ground layer which does not have an antipad). This may create a ring of conductive material around a portion of the ground layer that connects to the via.

In some implementations, a back drill may remove all conductive material associated with a stub region of the via. For example, if a drill bit of a back drill is properly centered between sides of a primary drill hole, the back drill may remove all conductive material within the via (and will not leave a sliver of conductive material). In this case, the drill bit may leave a ring of conductive material around the ground layer due to back drilling without an antipad between the ground layer and the via.

In some implementations, a back drill may remove a portion of the conductive material associated with a stub region of the via but may leave a sliver. For example, if a drill bit of a back drill is not properly centered between sides of a primary drill hole, the back drill may leave a sliver of conductive material within the via. A drill bit may not be properly centered if the drill is not registered properly (e.g., a drilling location identified by software may not be centered), if the drill slips out of position upon making initial contact with the PCB, or the like. In this case, the drill bit may leave a ring of conductive material around the ground layer due to back drilling without an antipad between the ground layer and the via. Additionally, the sliver of conductive material may connect to the ring of conductive material.

In this way, a back drill that is not properly centered may create a sliver of conductive material that connects to a ring of conductive material around the ground layer, thereby allowing an electrical test to detect the sliver.

As further shown in FIG. 3, process 300 may include performing an electrical test to determine whether a sliver of conductive material is included within the via (block 330). For example, the PCB design process may include an electrical test (e.g., an in-circuit test (ICT)) that may be performed to determine whether a sliver of conductive material is included within the via.

In some implementations, the PCB design process may perform an electrical test on the via. For example, an electrical probe may perform an ICT on a PCB to check for shorts, opens, resistance, capacitance, or the like. In some cases, the electrical probe may provide electrical current to the via to determine whether a sliver of conductive material connected to the ground layer creates a short circuit.

As an example, assume a drill bit used for back drilling is properly centered and removes a portion of the stub region. In this case, an electrical probe may provide electrical current to the via, and the electrical current may remain within the via (and not come into contact with the ground layer, as shown by the first image in FIG. 1C). This may cause the via to pass the electrical test, indicating that there are no slivers of conductive material within the via.

As another example, assume a drill bit used for back drilling is not properly centered and removes a portion of the stub region (and in doing so, creates a sliver of conductive material). In this case, an electrical probe may provide current to the via, and the current may travel through the sliver of conductive material and through the ground layer to create a short circuit (shown by the second image in FIG. 1C). This may cause the via to fail the electrical test, indicating that there is a sliver of conductive material within the via.

In some implementations, a test machine (i.e., a device capable of automatically performing electrical tests) may include a set of probes that may perform a set of electrical tests concurrently. For example, the test machine may move a probe of the set of probes to a first via, conduct an electrical test, store a test result (e.g., pass, fail, etc.), and may move the probe to a second via to perform an additional electrical test. In some cases, probes may be configured to stagger the electrical tests (e.g., perform the electrical tests at different time intervals), and may record a time stamp indicating a time that the electrical test begins and a time stamp indicating a time that the electrical test ends. Additionally, the probes may record a time stamp in the event of a short circuit. This may allow multiple probes to test vias associated with the same ground layer. For example, assume one copper sliver causes the entire ground layer to short circuit (and causes all concurrently performing electrical tests to fail). In this case, the test machine may check time stamps to identify which concurrently tested via includes the copper sliver.

In some implementations, an electrical test may be performed on hundreds, thousands, tens of thousands, even hundreds of thousands of vias concurrently. In this way, an electrical test may be used to detect all (or some) copper slivers included within a PCB in a time efficient manner (relative to testing one via at a time).

Additionally, or alternatively, an electrical test may be implemented using a test coupon. For example, assume a PCB is designed to include a test coupon (e.g., a test structure). In this case, an electrical probe may perform an electrical test on the test coupon, which may be located at an edge of the PCB. In this way, the test coupon may be used to determine whether a sliver of conductive material is included within vias of the PCB. In some implementations, an electrical test may be performed on a test coupon and a subset of layers within the PCB (e.g., the critical layers).

In some implementations, vias associated with identified slivers may be re-drilled and re-tested. For example, assume an electrical test detects a sliver of conductive material included in a via. In this case, the via may be re-drilled to remove the copper sliver. Additionally, the test machine may use a probe to run an additional electrical test on the via to ensure that the sliver of conductive material has been removed.

By performing an electrical test to detect the slivers of conductive material, vias associated with the slivers of conductive material may be re-drilled and re-tested to determine that the sliver has been removed, thereby reducing signal attenuation and cross talk relative to a PCB that does not detect and/or remove slivers of conductive material.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

By reducing stub length via back drilling, a PCB design process reduces signal distortion (e.g., deterministic jitter). Furthermore, by using an electrical test to detect slivers of conductive material within vias of a PCB, the PCB design process reduces signal attenuation and crosstalk relative to a PCB design process that is unable to detect the slivers of conductive material.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
    obtaining a printed circuit board (PCB) that includes:
        a set of pads associated with facilitating a connection to a component,
        a set of vias electrically connected to the set of pads, the set of vias including a set of stub regions, a set of layers perpendicular to the set of vias,
the set of layers including a signal layer and a ground layer, and
the ground layer being located between the set of stub regions and the signal layer;
drilling to remove at least a portion of a stub region of a via of the set of vias,
the drilling to create a ring of conductive material around a portion of the ground layer that connects to the via and around a portion of a primary drill hole;
performing an electrical test to determine whether conductive material is included within the via after drilling to remove at least the portion of the stub region of the via; and
performing, based on a result of performing the electrical test, at least one of:
additional drilling to remove at least the portion of the stub region when the conductive material is determined to be included within the via, or
performing an additional electrical test to determine whether the conductive material is included within the via.

2. The method of claim 1, where the ground layer connects to the via without an antipad between the ground layer and the via.

3. The method of claim 1, where drilling to remove at least the portion of the stub region of the via comprises:
drilling at least the portion of the stub region of the via in a manner that removes all conductive material associated with the stub region of the via; and
where performing the electrical test comprises:
performing the electrical test to determine that a sliver of conductive material is not included within the via.

4. The method of claim 3, where performing the electrical test comprises:
providing, using an electrical probe, an electrical current to the via after the drilling,
the electrical current to flow from the electrical probe to the via and not to the ground layer.

5. The method of claim 1, where drilling to remove the at least the portion of the stub region of the via comprises:
drilling at least the portion ot the stub region ot the via in a manner that leaves a sliver ot conductive material within the via; and
where performing the electrical test comprises:
performing the electrical test to detect the sliver of conductive material within the via.

6. The method of claim 5, where performing the electrical test comprises:
providing, using an electrical probe, an electrical current to the via after performing the drilling,
the electrical current to cause a short circuit,
the short circuit causing the via to fail the electrical test, indicating that the sliver of conductive material is present within the via.

7. The method of claim 1, where performing the electrical test comprises:
integrating the electrical test into circuitry of the PCB; and
performing the electrical test on the via after integrating the electrical test into the circuitry of the PCB.

8. The method of claim 1, where the PCB is to include a test structure and where performing the electrical test comprises:
performing the electrical test on the test structure and a subset of layers within the PCB to determine whether a sliver of conductive material is included within the via of the PCB.

9. A method, comprising:
obtaining a printed circuit board (PCB) that includes:
a set of vias,
the set of vias including a set of stub regions,
a set of layers perpendicular to the set of vias,
the set of layers including a signal layer and a ground layer, and
the ground layer being located between the set of stub regions and the signal layer;
drilling to remove at least a portion of a stub region of a via of the set of vias,
wherein drilling to remove at least the portion of the stub region creates a ring of conductive material around a portion of the ground layer that connects to the via and around a portion of a drill hole;
performing an electrical test to determine whether conductive material is included within the via after drilling to remove at least the portion of the stub region of the via; and
performing, based on a result of performing the electrical test, at least one of:
additional drilling to remove at least the portion of the stub region when the conductive material is determined to be included within the via, or
performing an additional electrical test to determine whether the conductive material is included within the via.

10. The method of claim 9, where drilling to remove at least the portion of the stub region of the via comprises:
drilling to create a ring of conductive material around a portion of the ground layer that connects to the via.

11. The method of claim 9, where drilling to remove at least the portion of the stub region of the via comprises:
drilling at least the portion of the stub region of the via,
the drilling to remove all conductive material associated with at least the portion of the stub region of the via; and
where performing the electrical test comprises:
performing the electrical test to determine that a sliver of conductive material is not included within the via.

12. The method of claim 11, where performing the electrical test comprises:
providing an electrical current to the via,
the electrical current to flow from an electrical probe to the via and not to the ground layer.

13. The method of claim 9, where drilling to remove at least the portion of the stub region of the via comprises:
drilling at least the portion of the stub region of the via,
the drilling to leave a sliver of conductive material within the via; and
where performing the electrical test comprises:
performing the electrical test to detect the sliver of conductive material within the via.

14. The method of claim 13, where performing the electrical test comprises:
providing an electrical current to the via,
the electrical current to cause a short circuit,
the short circuit causing the via to fail the electrical test.

15. The method of claim 9, where performing the electrical test comprises:

integrating the electrical test into circuitry of the PCB; and performing the electrical test using the circuitry of the PCB.

16. A method, comprising:
    obtaining a printed circuit board (PCB) that includes:
        a set of vias,
        the set of vias including a set of stub regions,
        a set of layers perpendicular to the set of vias,
        the set of layers including a signal layer and a ground layer,
        antipads not being present between the ground layer and the set of vias, and
        the ground layer being located between the set of stub regions and the signal layer;
    drilling to remove at least a portion of a stub region of a via of the set of vias,
        wherein drilling to remove at least the portion of the stub region creates a ring of conductive material around a portion of the ground layer that connects to the via and around a portion of a drill hole;
    performing an electrical test to determine whether conductive material is included within the via after drilling to remove at least the portion of the stub region of the via; and
    performing, based on a result of performing the electrical test, at least one of:
        additional drilling to remove at least the portion of the stub region when the conductive material is determined to be included within the via, or
        performing an additional electrical test to determine whether the conductive material is included within the via.

17. The method of claim 16, where drilling to remove at least the portion of the stub region of the via comprises:
    drilling to create a ring of conductive material around a portion of the ground layer that connects to the via.

18. The method of claim 16, where drilling to remove at least the portion of the stub region of the via comprises:
    drilling at least the portion of the stub region of the via,
        the drilling to remove all conductive material associated with at least the portion of the stub region of the via; and
    where performing the electrical test comprises:
        performing the electrical test to determine that a sliver of conductive material is not included within the via.

19. The method of claim 18, where performing the electrical test comprises:
    providing an electrical current to the via,
        the electrical current to flow from an electrical probe to the via and not to the ground layer.

20. The method of claim 16, where the PCB is to include a test structure and where performing the electrical test comprises:
    performing the electrical test on the test structure and a subset of layers within the PCB to determine whether a sliver of conductive material is included within the via of the PCB.

* * * * *

UNITED STATES PATENT AND TRADEMARK OFFICE
CERTIFICATE OF CORRECTION

PATENT NO. : 11,570,908 B2
APPLICATION NO. : 17/248569
DATED : January 31, 2023
INVENTOR(S) : Steve Wilkinson et al.

Page 1 of 1

It is certified that error appears in the above-identified patent and that said Letters Patent is hereby corrected as shown below:

In the Claims

Claim 5:
Column 9, Lines 44-46, change "drilling at least the portion ot the stub region of the via in a manner that leaves a sliver ot conductive material within the via; and" to --drilling at least the portion of the stub region of the via in a manner that leaves a sliver of conductive material within the via; and--

Signed and Sealed this
Twenty-seventh Day of August, 2024

Katherine Kelly Vidal
*Director of the United States Patent and Trademark Office*